United States Patent
Khan et al.

(10) Patent No.: US 12,353,752 B2
(45) Date of Patent: Jul. 8, 2025

(54) READ DISTURB TRACKING BASED ON STATISTICAL PROBABILITY

(71) Applicant: Intel Corporation, Santa Clara, CA (US)

(72) Inventors: Mohammad Nasim Imtiaz Khan, Folsom, CA (US); Yogesh B. Wakchaure, Folsom, CA (US); Eric Hoffman, Lafayette, CO (US); Neal Mielke, Los Altos Hills, CA (US); Shirish Bahirat, Longmont, CO (US); Cole Uhlman, Vancouver (CA); Ye Zhang, Shanghai (CN); Anand Ramalingam, Portland, OR (US)

( * ) Notice: Subject to any disclaimer, the term of this patent is extended or adjusted under 35 U.S.C. 154(b) by 778 days.

(21) Appl. No.: 17/481,786

(22) Filed: Sep. 22, 2021

(65) Prior Publication Data

US 2022/0004335 A1  Jan. 6, 2022

(51) Int. Cl.
*G06F 3/00* (2006.01)
*G06F 3/06* (2006.01)
*G11C 16/00* (2006.01)
*G11C 16/34* (2006.01)

(52) U.S. Cl.
CPC .......... *G06F 3/0655* (2013.01); *G06F 3/0604* (2013.01); *G06F 3/0679* (2013.01); *G11C 16/3418* (2013.01); *G11C 16/3422* (2013.01)

(58) Field of Classification Search
CPC .... G06F 3/0655; G06F 3/0604; G06F 3/0679; G11C 16/3418; G11C 16/3422
See application file for complete search history.

(56) References Cited

U.S. PATENT DOCUMENTS

| | | | |
|---|---|---|---|
| 2014/0136884 A1* | 5/2014 | Werner | G11C 16/3422 714/6.11 |
| 2014/0281766 A1* | 9/2014 | Yang | G11C 11/56 714/721 |
| 2022/0179563 A1* | 6/2022 | Sharifi Tehrani | G06F 3/0679 |

* cited by examiner

Primary Examiner — Reginald G Bragdon
Assistant Examiner — Michael L Westbrook
(74) Attorney, Agent, or Firm — Haley Guiliano LLP

(57) ABSTRACT

An embodiment of an electronic apparatus may include one or more substrates, and a controller coupled to the one or more substrates, the controller including circuitry to control access to NAND-based storage media that includes a plurality of NAND devices, maintain respective read disturb (RD) counters for each of two or more tracked units at respective granularities, maintain respective global RD counters for each of the two or more tracked units and, in response to a read request, increment one or more global RD counters that correspond to the read request, determine if a global RD counter for a tracked unit matches a random number associated with the tracked unit and, if so determined, increment a RD counter for the tracked unit that corresponds to the read request and generate a new random number for the tracked unit. Other embodiments are disclosed and claimed.

24 Claims, 9 Drawing Sheets

READ DISTURB TRACKING BASED ON STATISTICAL PROBABILITY

BACKGROUND

Certain NAND media devices may allow either a single read or single program operation command (i.e., a write command) to access a NAND device or NAND array in a NAND device at a time, where a NAND array may comprise an array of NAND strings, and where a NAND string may comprise a plurality of NAND cells. A program operation on a NAND device or NAND array in a NAND device performs a write operation on the NAND media. A program operation may be performed for programming (i.e., writing) to a NAND, such as a multi-level cell (MLC) NAND. Program operations may also be performed for other types of NAND (e.g., quad level cell (QLC), tri-level cell (TLC), single level cell (SLC), etc.) and other types of non-volatile memory. Read disturb may refer to an issue where reading a memory cell can cause nearby cells in the same memory block to change its programmed threshold if the cell is read too many times without any intervening erase or program operation (e.g., hundreds of thousands of reads between intervening erase operations). The cell being read does not fail, but one of the surrounding cells may fail on a subsequent read. To avoid the read disturb problem the flash controller will typically count the total number of reads to a granularity since the last erase. When the count exceeds a target limit, the affected block is copied over to a new block, erased, then released to the block pool.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
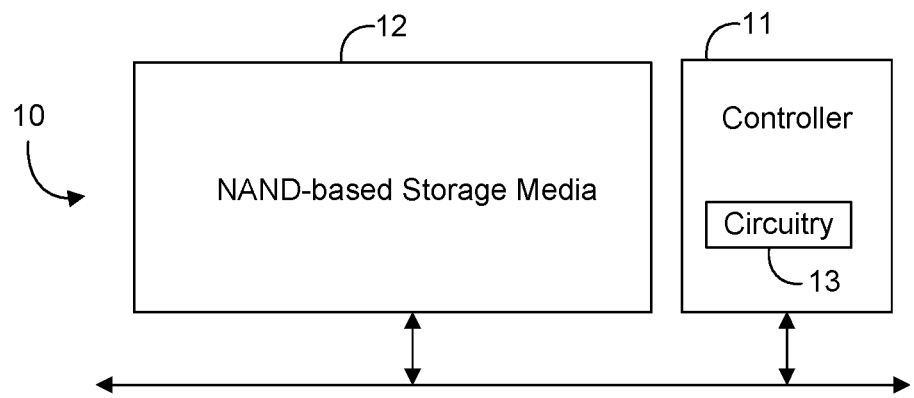
FIG. 1 is a block diagram of an example of an electronic storage system according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, firmware, software, or any combination thereof. The material disclosed herein may also be implemented as instructions stored on a machine-readable medium, which may be read and executed by one or more processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of RAM, such as dynamic RAM (DRAM) or static RAM (SRAM). One particular type of DRAM that may be used in a memory module is synchronous dynamic RAM (SDRAM). NV memory (NVM) may be a storage medium that does not require power to maintain the state of data stored by the medium. In one embodiment, the memory device may include a block addressable memory device, such as those based on NAND technologies. In one embodiment, the memory device may be or may include memory devices that use multi-threshold level NAND flash memory, or other memory. The memory device may refer to the die itself and/or to a packaged memory product.

With reference to FIG. 1, an embodiment of an electronic storage system 10 may include NAND-based storage media 12 that includes a plurality of NAND devices, and a controller 11 communicatively coupled to the NAND-based storage media 12. For example, a NAND device may correspond to a single NAND die. The controller 11 may include circuitry 13 to maintain two or more read disturb (RD) counters respectively for two or more tracked entities that correspond to different tracking granularities for the NAND-based storage media 12, and to track RD exposure for the NAND-based storage media 12 based on respective statistical probability curves applied to read requests for each of the two or more tracked entities. For example, a tracked entity may have any useful granularity such as a wordline (WL), a selected granularity that spans two or more WLs, a band, an erase block (EB), etc.

In some embodiments, the circuitry 13 may be configured to utilize a random number distribution for one of the statistical probability curves for a single entity of the two or more entities. For example, the circuitry 13 may be configured to manage randomness across the two or more entities, and also to manage randomness within the single entity of the two or more entities. A probability range between respective ends of one or more of the statistical probability curves may be based on a power function (e.g., as described in more detail below). The circuitry 13 may also be configured to track a single read command exposure with two or more independent RD counters. For example, the circuitry 13 may be configured to track a single physical WL exposure with four independent RD counters. In any of the embodiments herein, the controller 11 and the NAND-based storage media 12 may be incorporated in a solid-state drive (SSD).

Embodiments of each of the above controller 11, NAND-based storage media 12, circuitry 13, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the controller 11 may include a general purpose controller, a special purpose controller, a memory controller, a storage controller, a micro-controller, a general purpose processor, a special purpose processor, a central processor unit (CPU), an execution unit, etc. In some embodiments, the NAND-based storage media 12, the circuitry 13, and/or other system memory may be located in, or co-located with, various components, including the controller 11 (e.g., on a same die).

Alternatively, or additionally, all or portions of these components may be implemented in one or more modules as a set of logic instructions stored in a machine- or computer-readable storage medium such as RAM, ROM, programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C# or the like and conventional procedural programming languages, such as the "C" programming language or similar programming languages. For example, the NAND-based storage media 12, other NAND-based storage media, or other system memory may store a set of instructions which when executed by the controller 11 cause the system 10 to implement one or more components, features, or aspects of the system 10 (e.g., the circuitry 13, maintaining the RD counters, tracking RD exposure based on statistical probability curves, etc.).

Figure 2:
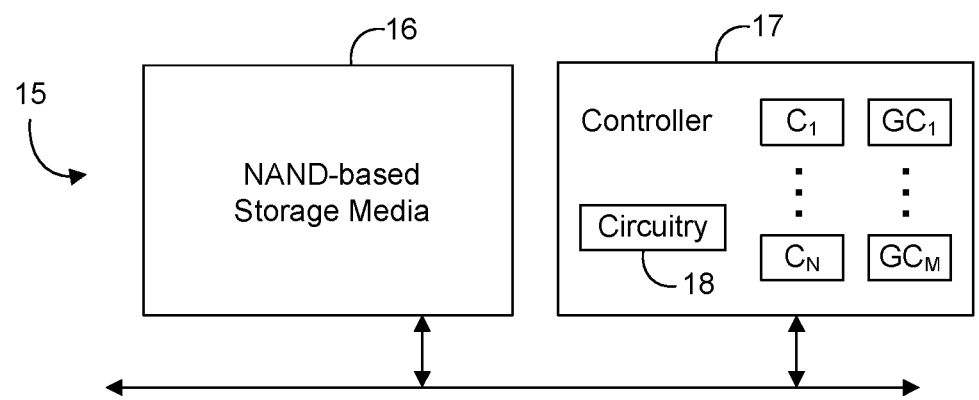
FIG. 2 is a block diagram of another example of an electronic storage system according to an embodiment.

With reference to FIG. 2, an embodiment of an electronic storage system 15 may include NAND-based storage media 16 that includes a plurality of NAND devices, and a controller 17 communicatively coupled to the NAND-based storage media 16. For example, a NAND device may correspond to a single NAND die. The controller 17 may include circuitry 18 to maintain respective RD counters ($C_1$ through $C_N$, N>1) for each of two or more tracked units at respective granularities, maintain respective global RD counters ($GC_1$ through $GC_M$, M>1) for each of the two or more tracked units and, in response to a read request, increment one or more global RD counters that correspond to the read request, determine if a global RD counter for a tracked unit matches a random number associated with the tracked unit, and, if so determined, increment a RD counter for the tracked unit that corresponds to the read request and generate a new random number for the tracked unit. For example, a tracked unit may have any useful granularity. In one example, one of the two or more tracked units may correspond to a WL, and the circuitry 18 may be configured to maintain respective per WL per source gate select (SGS) RD counters. In another example, one of the two or more tracked units may correspond to a selected granularity that spans two or more WLs, and the circuitry 18 may be configured to maintain respective per selected granularity RD counters. In another example, one of the two or more tracked units may correspond to an EB, and the circuitry 18 may be configured to maintain respective per EB RD counters.

In some embodiments, the circuitry 18 may be further configured to determine if one or more of the RD counters exceeds a threshold and, if so determined, trigger relocation of the data. The circuitry 18 may also be configured to journal RD counter information. In some embodiments, at initialization, the circuitry 18 may be configured to initialize all of the RD counters for each of the two or more tracked units to zero, initialize all of the global RD counters for each of the two or more tracked units to zero, and generate respective random numbers for each of the two or more tracked units. In response to a reset for a tracked unit, the circuitry 18 may be configured to reset all of the RD counters for the tracked unit to zero. In any of the embodiments herein, the controller 17 and the NAND-based storage media 16 may be incorporated in a SSD.

Embodiments of each of the above controller 17, NAND-based storage media 16, circuitry 18, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the controller 17 may include a general purpose controller, a special purpose controller, a memory controller, a storage controller, a micro-controller, a general purpose processor, a special purpose processor, a central processor unit (CPU), an execution unit, etc. In some embodiments, the NAND-based storage media 16, the circuitry 18, and/or other system memory may be located in, or co-located with, various components, including the controller 17 (e.g., on a same die).

Alternatively, or additionally, all or portions of these components may be implemented in one or more modules as a set of logic instructions stored in a machine- or computer-readable storage medium such as RAM, ROM, programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C# or the like and conventional procedural programming languages, such as the "C" programming language or similar programming languages. For example, the NAND-based storage media 16, other NAND-based storage media, or other system memory may store a set of instructions which when executed by the controller 17 cause the system 15 to implement one or more components, features, or aspects of the system 15 (e.g., the circuitry 18, maintaining the RD counters, maintain the global RD counters, incrementing the RD counters and the global RD counters, generating the random numbers, etc.).

Figure 3:
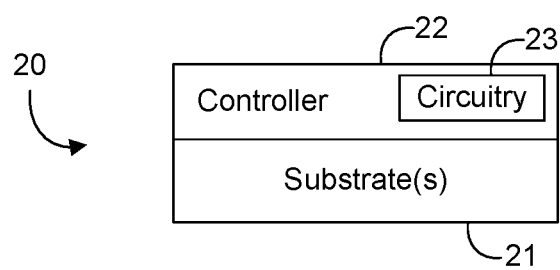
FIG. 3 is a block diagram of an example of an electronic apparatus according to an embodiment.
Figure 4A:
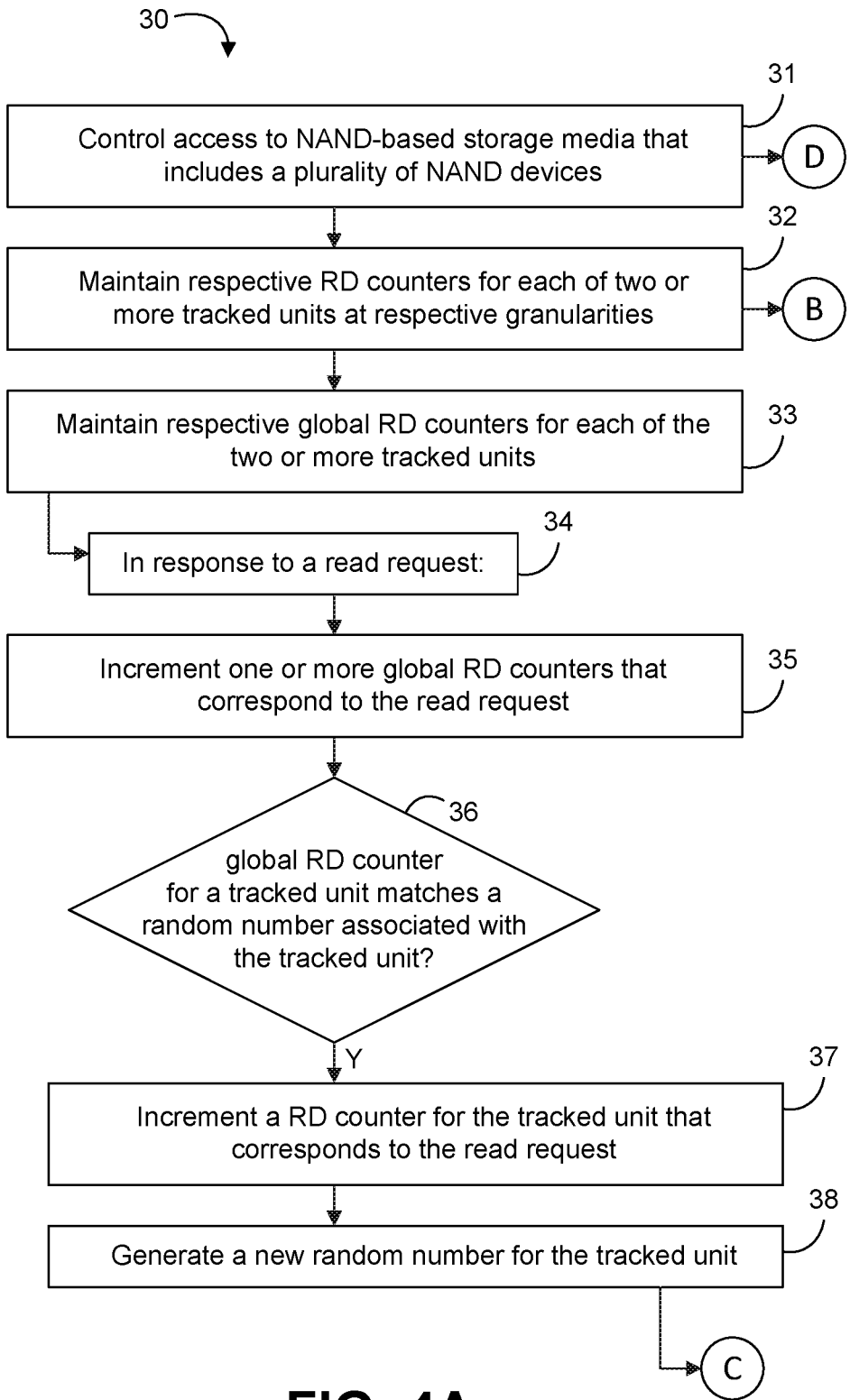
FIGS. 4A to 4D is a flowchart of an example of a method of controlling storage according to an embodiment.
Figure 4B:
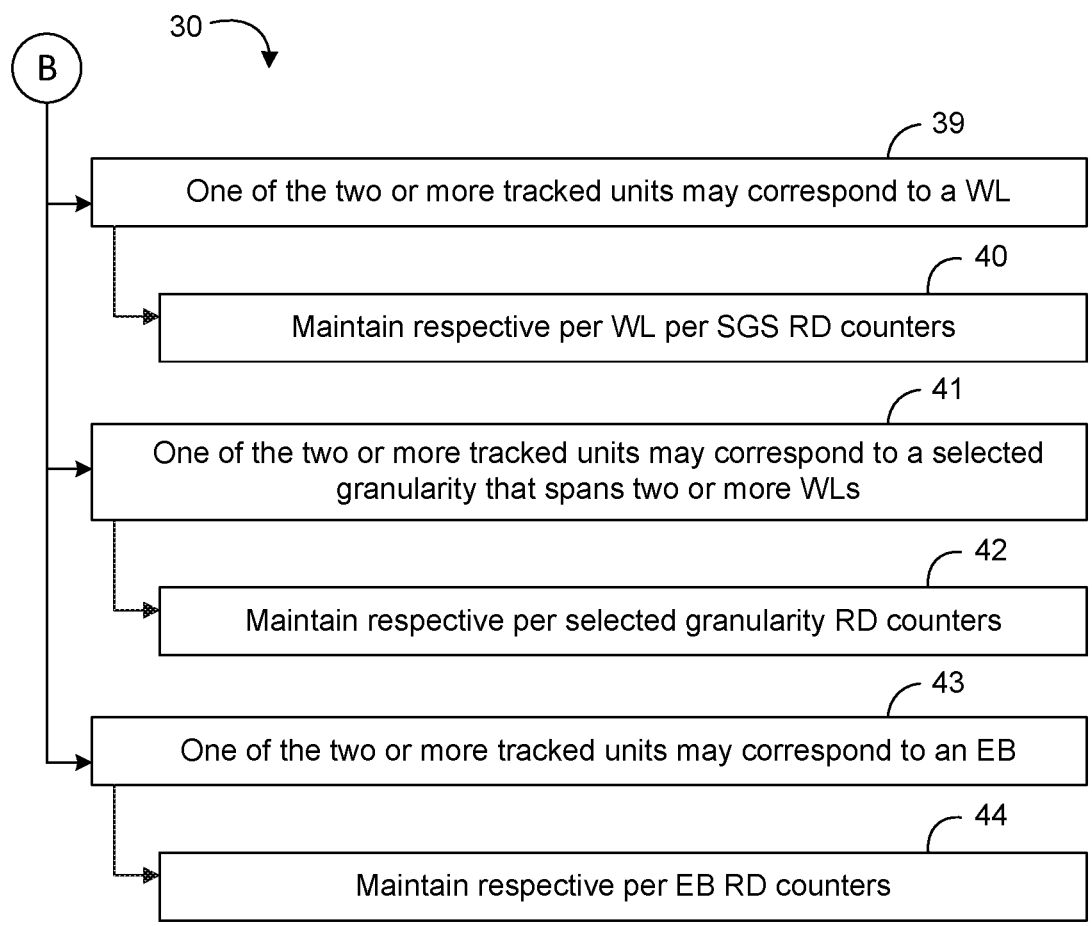
Figure 4C:
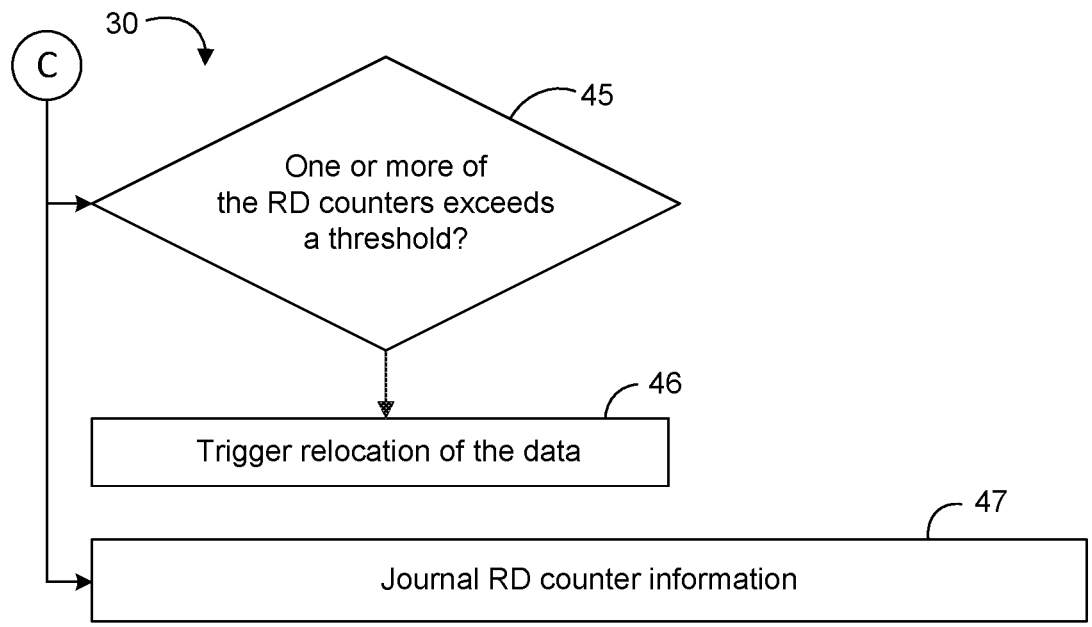
Figure 4D:
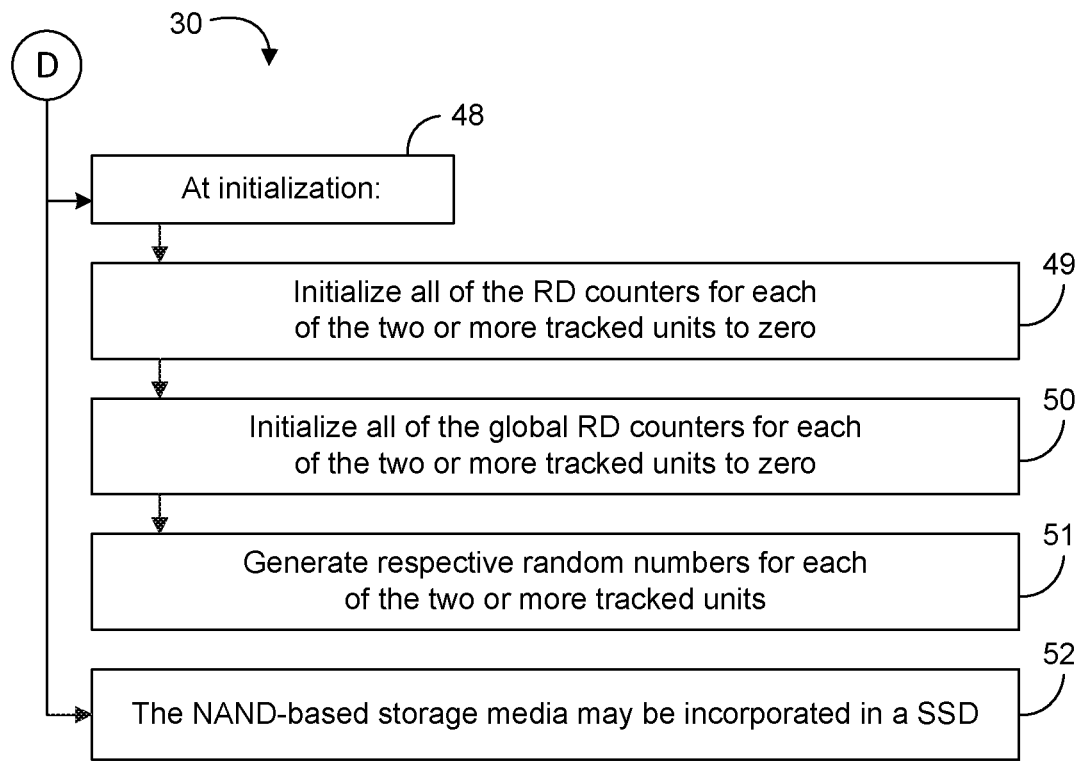

Turning now to FIG. 3, an embodiment of an electronic apparatus 20 may include one or more substrates 21, and a controller 22 coupled to the one or more substrates 21. The controller 22 may include circuitry 23 to control access to NAND-based storage media that includes a plurality of NAND devices, maintain respective RD counters for each of two or more tracked units at respective granularities, maintain respective global RD counters for each of the two or more tracked units and, in response to a read request, increment one or more global RD counters that correspond to the read request, determine if a global RD counter for a tracked unit matches a random number associated with the tracked unit and, if so determined, increment a RD counter for the tracked unit that corresponds to the read request and generate a new random number for the tracked unit. For example, a tracked unit may have any useful granularity. In one example, one of the two or more tracked units may correspond to a WL, and the circuitry 23 may be configured to maintain respective per WL per SGS RD counters. In another example, one of the two or more tracked units may correspond to a selected granularity that spans two or more WLs, and the circuitry 23 may be configured to maintain respective per selected granularity RD counters. In another example, one of the two or more tracked units may correspond to an EB, and the circuitry 23 may be configured to maintain respective per EB RD counters.

In some embodiments, the circuitry 23 may be further configured to determine if one or more of the RD counters exceeds a threshold and, if so determined, trigger relocation of the data. The circuitry 23 may also be configured to journal RD counter information. In some embodiments, at initialization, the circuitry 23 may be configured to initialize all of the RD counters for each of the two or more tracked units to zero, initialize all of the global RD counters for each of the two or more tracked units to zero, and generate respective random numbers for each of the two or more tracked units. In response to a reset for a tracked unit, the circuitry 23 may be configured to reset all of the RD counters for the tracked unit to zero. In any of the embodiments herein, the controller 22 and the NAND-based storage media may be incorporated in a SSD.

Embodiments of the circuitry 23 may be implemented in a system, apparatus, computer, device, etc., for example, such as those described herein. More particularly, hardware implementations of the circuitry 23 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the circuitry 23 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the circuitry 23 may be implemented on a semiconductor apparatus, which may include the one or more substrates 21, with the circuitry 23 coupled to the one or more substrates 21. In some embodiments, the circuitry 23 may be at least partly implemented in one or more of configurable logic and fixed-functionality hardware logic on semiconductor substrate(s) (e.g., silicon, sapphire, gallium-arsenide, etc.). For example, the circuitry 23 may include a transistor array and/or other integrated circuit components coupled to the substrate(s) 21 with transistor channel regions that are positioned within the substrate(s) 21. The interface between the circuitry 23 and the substrate(s) 21 may not be an abrupt junction. The circuitry 23 may also be considered to include an epitaxial layer that is grown on an initial wafer of the substrate(s) 21.

Turning now to FIGS. 4A to 4D, an embodiment of a method 30 of controlling storage may include controlling access to NAND-based storage media that includes a plurality of NAND devices at box 31, maintaining respective RD counters for each of two or more tracked units at respective granularities at box 32, maintaining respective global RD counters for each of the two or more tracked units at box 33 and, in response to a read request at box 34, incrementing one or more global RD counters that correspond to the read request at box 35, determining if a global RD counter for a tracked unit matches a random number associated with the tracked unit at box 36 and, if so determined, incrementing a RD counter for the tracked unit that corresponds to the read request at box 37, and generating a new random number for the tracked unit at box 38. The tracked unit may have any useful granularity. In one example, one of the two or more tracked units may correspond to a WL at box 39, and the method 30 may include maintaining respective per WL per SGS RD counters at box 40. In another example, one of the two or more tracked units may correspond to a selected granularity that spans two or more WLs at box 41, and the method 30 may include maintaining respective per selected granularity RD counters at box 42. In another example, one of the two or more tracked units may correspond to an EB at box 43, and the method 30 may include maintaining respective per EB RD counters at box 44.

Some embodiments of the method 30 may further include determining if one or more of the RD counters exceeds a threshold at box 45 and, if so determined, triggering relocation of the data at box 46. The method 30 may also include journaling RD counter information at box 47. In some embodiments, at initialization at box 48, the method 30 may include initializing all of the RD counters for each of the two or more tracked units to zero at box 49, initializing all of the global RD counters for each of the two or more tracked units to zero at box 50, and generating respective random numbers for each of the two or more tracked units at box 51. In any of the embodiments herein, the NAND-based storage media may be incorporated in a SSD at box 52.

Embodiments of the method 30 may be implemented in a system, apparatus, computer, device, etc., for example, such as those described herein. More particularly, hardware implementations of the method 30 may include configurable logic such as, for example, PLAs, FPGAs, CPLDs, Course-Grained Reconfigurable Fabric (CGRA), or in fixed-functionality logic hardware using circuit technology such as, for example, ASIC, CMOS, or TTL technology, or any combination thereof. Alternatively, or additionally, the method 30 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the method 30 may be implemented on a computer readable medium as described in connection with Examples 25 to 32 below. Embodiments or portions of the method 30 may be implemented in firmware, applications (e.g., through an application programming interface (API)), or driver software running on an operating system (OS). Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Some embodiments may advantageously provide technology for read disturb exposure tracking with minimal computational overhead while maintaining data reliability through minimum relocations. NAND flash data reliability exposure and risk continues to grow as memory cells store more bits per cell, memory nodes are scaled down increased areal density, and the number of layers that store data are increased to deliver higher capacity devices through three-dimensional (3D) memory technology. One contributor to reduced reliability is the read disturb (RD) problem. Data reliability for a program-erase (PE) cycled device exacerbates the RD exposure and error rates, particularly towards the device's end-of-life.

In some NAND devices, a read is performed by applying a read reference voltage to the word line that contains the data to be read from a physical block. Sense amplifiers detect if the NAND devices on the word line being read are programmed to 0 or 1 values. However, to read data from a NAND device bit line, all other devices on the same bit line must be switched on by applying a pass-through voltage. The pass-through voltage allows the data being read to propagate through to the sense amplifier. Applying the pass-through voltage to all other NAND devices from which data not being read can cause the threshold voltages of unread cells in the same block to shift at higher values. This shift in threshold voltage due to read process may be referred to as RD.

Advanced SSD devices may support millions of input/output operations per second (IOPs), which allows 300 to 500 nanoseconds per command service time. Accordingly, optimization of a fast data path especially to service reads may be an important performance consideration. DRAM access in the fast path should also support access times between 100 to 200 nanoseconds, depending on the DDR speeds and data width. Consuming a high percentage (e.g., about 50%) of the budget to track RD counters on every read is problematic for practical implementations. Conventional technology for RD tracking may be either non-performant or overly conservative. For lower performance drive there is possibility to track reads through per erase block or per physical NAND wordline RD counters and these RD counters can be incremented real time. In overly conservative RD tracking technology, as current reads are being serviced, eviction on the block or indirection unit randomly can provide RD protection at the cost of significantly increased RD driven write amplification. Some advanced NAND devices may have lower PE capability. Accordingly, consuming the PE cycles for RD related conservative relocations is problematic. Advantageously, embodiments provide technology to overcome one or more of the foregoing problems.

Some embodiments may scale with performance and may consume significantly less time for DRAM access per command, improving IOPs capability. Some embodiments may involve four to five times lower RD driven write amplification, enabling lower PE cycle QLC and PLC NAND. Some embodiments may reduce or eliminate RD exposure to WLs that are more sensitive to RD issues by significantly increasing tracking granularity without increasing computational overhead. Some embodiments provide RD tracking technology that is adaptable with high accuracy for per PE cycle thresholds. Instead of thresholds that are globally scaled because the tracking granularity is a much larger unit (e.g., a band or EB). In some embodiments track and adapt the RD exposure to a smallest granularity that is part of a word line.

Conventional RD tracking technology may not be effective for tracking post RD event exposure, where the host continues to issue reads to the affected word line. Some embodiments may include technology to effectively track the post RD event exposure and also includes adaptability of counter granularity to minimize further degradation of data by invoking actions. Some embodiment may further include technology for RD tracking of open wordlines. Each wordline may include many counters for tracking to provide suitable tracking granularity, and independent thresholds are supported for each segment (e.g., which may work with emerging architectures, such as Zoned Namespace (ZNS)).

Because RD exposure may grow as NAND memory technology advances, some embodiments provide RD tracking technology to mitigate RD exposure in such a way that: 1) data reliability is maintained accurately per bit voltage ranges are going down; 2) the RD tracking is readily adapted to the PE cycle consumption; 3) the RD tracking is scalable; 4) over relocations are reduced or minimized to conserve NAND PE cycles; 5) relocation driven performance challenges are reduced or minimized that can worsen quality-of-service (QoS) and IOPs; and/or 6) write amplification excessiveness caused by RD induced relocations are reduced or minimized.

Figure 5:
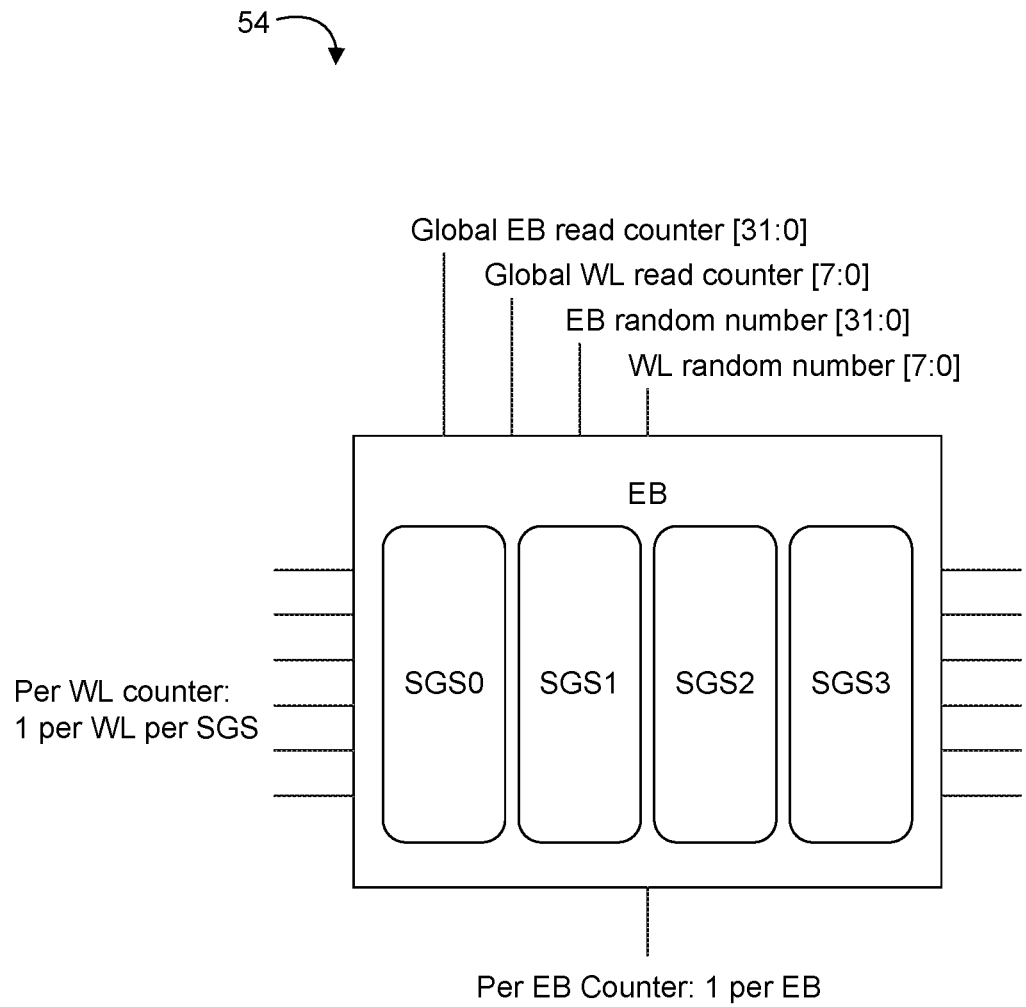
FIG. 5 is a block diagram of an example of NAND memory block according to an embodiment.

With reference to FIG. 5, an embodiment of a NAND memory device 54 includes a plurality of NAND devices that are organized in a several levels of granularity such as WLs, selected granularities (e.g., of subgroups of two WLs or more), bands, EBs, etc. The device 54 further includes a plurality of RD counters to track read activity at a wide variety of accuracy and granularity. As illustrated, the device 54 at least includes per WL counters, per EB counters (e.g., which may be optional in some embodiments), a global EB counter (e.g., 32 bits), and a global WL counter (e.g., 8 bits). For example, the device 54 may include one per EB counter for each EB. The device 54 may also include one per WL counter for each WL per SGS. The WL counters per SGS grouping may be four (4) groups per WL (e.g., a single EB may include SGS groups SGS0, SGS1, SGS2, and SGS3). The device 54 further includes storage (e.g., registers) for a plurality of random numbers and thresholds utilized as part of the RD tracking technology. As illustrated, the device 54 at least includes an EB random number (e.g., 32 bits) and a WL random number (e.g., 8 bits). The device 54 may utilize the RD counters to track RD exposure at a smallest granularity (e.g., as described below in connection with the method 60).

Figure 6:
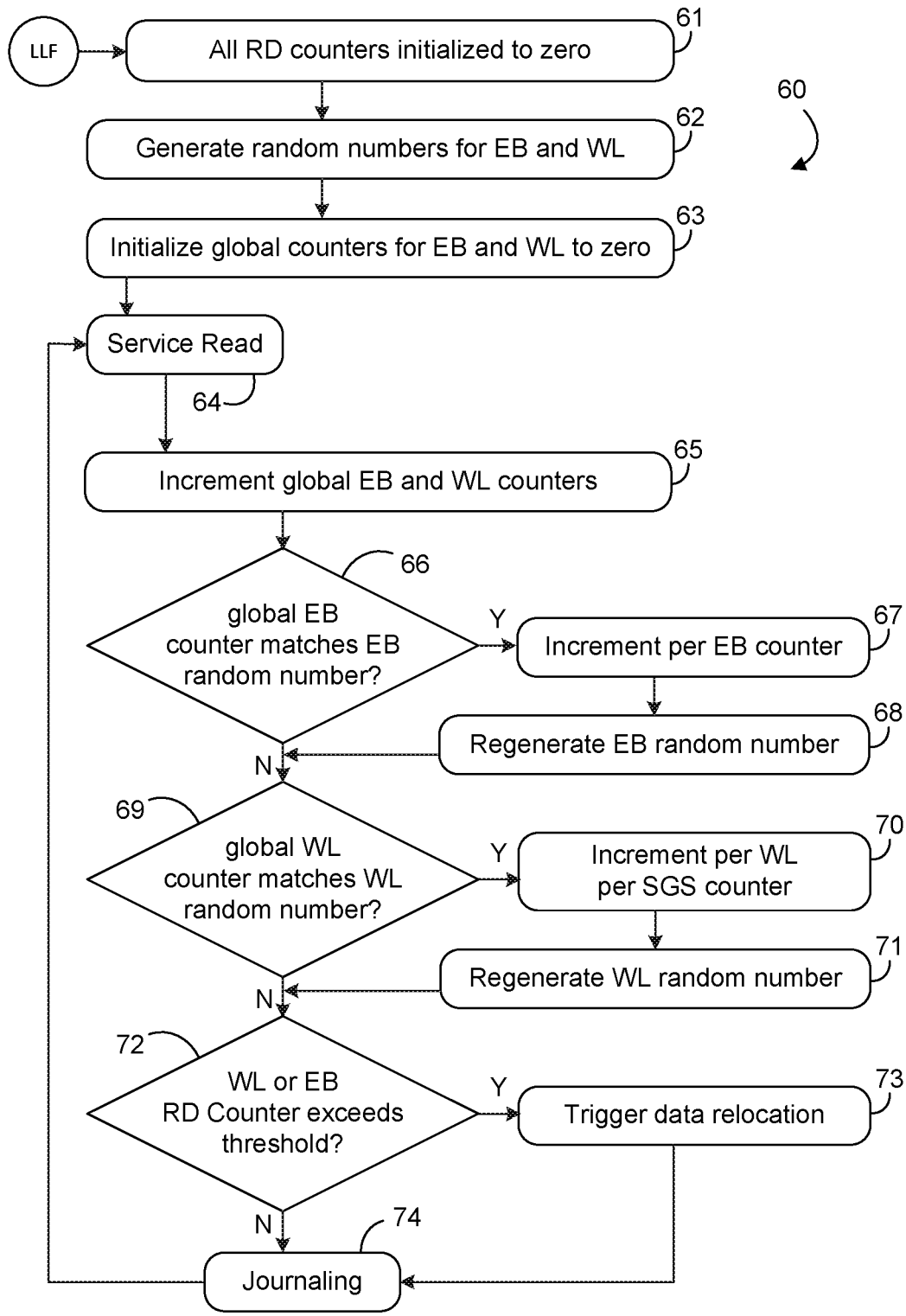
FIG. 6 is a flowchart of an example of a method of read disturb tracking according to an embodiment.

With reference to FIG. 6, a method 60 of tracking RD exposure may include initializing a set of variables (e.g., at initialization or low level format (LLF)). At box 61, all RD counters are initialized to zero. At box 62, the method 60 generates two random numbers, for EB and WL.

At box 63, the method initializes two global counters to zero, for EB and WL. The method 60 then is ready to service reads at box 64. To service a read (e.g., with respect to RD tracking), the method 60 first increments the global EB and WL counters at box 65. At box 66, the method 60 determines if the global EB counter matches the EB random number. If so, the method 60 proceeds to increment the per EB counter at box 67 and regenerates the per EB random number at box 68. The method 60 then proceeds to determine if the global WL counter matches the WL random number at box 69. If so, the method proceeds to increment the WL per SGS counter at box 70 and regenerates the per WL random number at box 71. The method 60 may then check for RD events. At box 72, the method 60 determines if either the WL or EB RD counter exceeds respective thresholds. If so, the method 60 proceeds to trigger data relocation at box 73. The method 60 may also include journaling at box 74.

Embodiments of the method 60 may be based on a random number distribution. With the method 60, even if a RD counter is tracked at a smallest granularity, the increment for the RD counter does not happen at every read but instead the increment for the RD counter is based on a statistical probability. Advantageously, embodiments may reduce computational complexity.

Also, unlike conventional RD tracking technology, some embodiments track a single read command exposure with many independent counters. As shown in FIG. 5, for example, a single physical WL exposure is tracked by four (4) counters. Advantageously, embodiments may provide higher data protectability as compared to conventional RD tracking technology.

Figure 7:
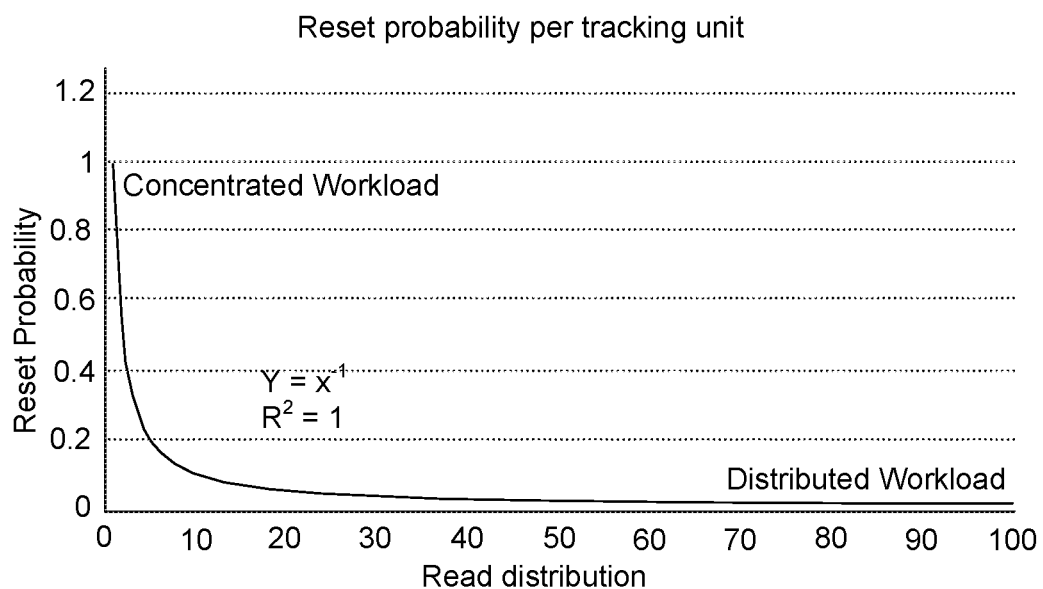
FIG. 7 is an illustrative graph of an example of reset probability versus read distribution according to an embodiment.

FIG. 7 shows an illustrated graph of reset probability versus read distribution. Host incoming workloads can be very unpredictable and can span from concentrated reads to purely random reads. Apart from locality, a workload component can also include types of accesses such as sequential and random. As utilized in the method 60, a random number is generated that will look at which specific block is going to be accessed when the global read counter matches the random number. FIG. 7 shows the reset probability of the random number for a nominal tracking granularity entity (such as WL, EB, etc.). The read distribution of an individual entity to which the host issues reads is on the X-axis (e.g., shown up to 100 to keep the plot readable; 100 WLs, or 100 EBs, etc.). The Y-axis shows a probability of resetting the random number and incrementing the counter when reads are concentrated to lower entities and random towards higher entities. A similar plot can be generated for concentrated workloads on any one of them by rotating the X-axis.

A sum of all the probabilities for reads issued to these entities always remains 1. Accordingly, when 100% of reads are issued to WL[1], a probability of resetting the random number and incrementing the RD counter for the Entities[1] is 100%, that is leftmost data. When reads are random and distributed to all entities, there is equal probability that any of them will get reset and increment. The probability range between these two extreme ends is a power function. Advantageously, embodiments of RD tracking based on a statistical probability curve works effectively under a wide variety of working conditions and with many types of workloads such as sequential, mixed, random, bursty, hot, etc. In some embodiments, the prediction variability may be adjusted as a function of a random number generation range.

Because embodiments of the probability curve utilize a power function as special case of a uniform distribution, the reset probability distribution also provides a flexible lifetime distribution that can offer a suitable fit to project some sets of failures. Some embodiments may be further enhanced by weighted increments with some other critical parameters such as number of bits corrected in a low-density parity check (LDPC) engine, device physics, etc.

Figure 8:
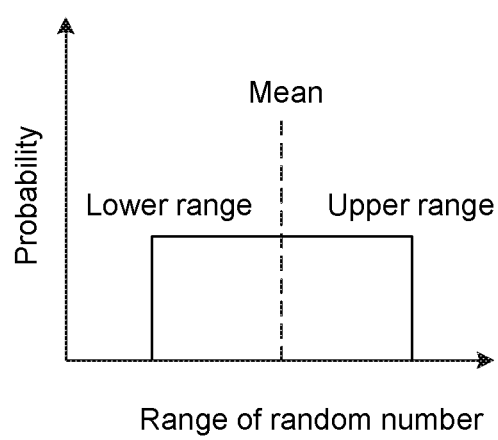
FIG. 8 is an illustrative graph of an example of probability versus range of random number according to an embodiment.

FIG. 8 shows a graph of probability versus range of random number. In some embodiments of the method 60, a random number generator that can be implemented within an embedded system may be utilized to generate the tracking unit random numbers to provide the uniform probability. When reads are issued to same entity and the counter gets reset to the number of reads that matches to the random number, then the statistical average of the counted reads converges to the actual reads even if the counter is incremented at a random interval. As shows in FIG. 8, sometimes the counter will be incremented at a lower range and other times the counter will be incremented at a higher range. However, because the random number generator has uniform distribution, both numbers will converge. Some embodiments may apply a combination of managing randomness in horizontal direction that is across the entities and managing randomness in within the single entity. Managing both may advantageously help to ensure that a wide variety of workloads (e.g., a random read workload, a bursty read workload, a hot read workload, etc.) can be reliably serviced.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 9:
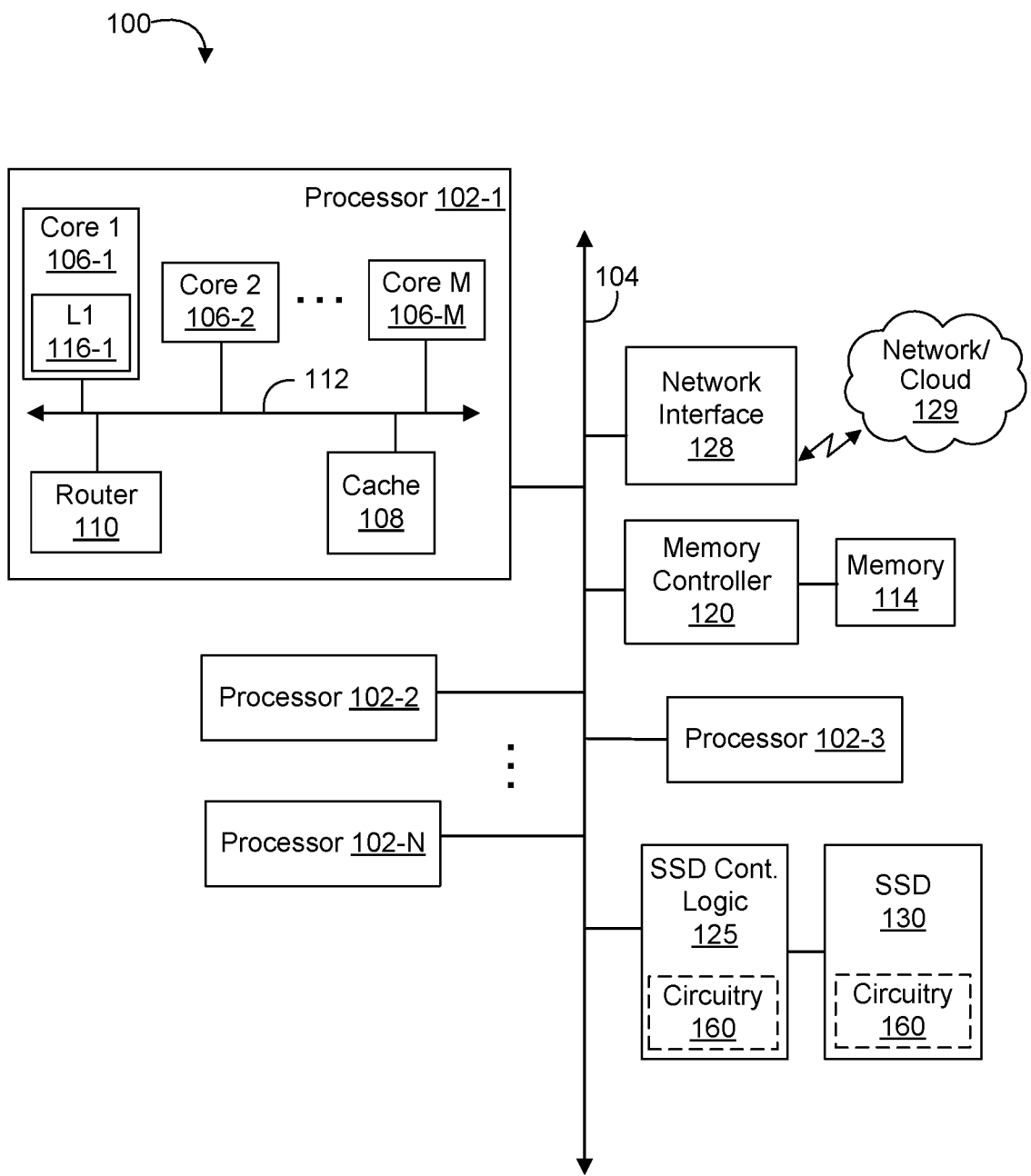
FIG. 9 is a block diagram of an example of a computing system according to an embodiment.

Turning now to FIG. 9, an embodiment of a computing system 100 may include one or more processors 102-1 through 102-N (generally referred to herein as "processors 102" or "processor 102"). The processors 102 may communicate via an interconnection or bus 104. Each processor 102 may include various components some of which are only discussed with reference to processor 102-1 for clarity. Accordingly, each of the remaining processors 102-2 through 102-N may include the same or similar components discussed with reference to the processor 102-1.

In some embodiments, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), memory controllers, or other components.

In some embodiments, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that is utilized by one or more components of the processor 102-1, such as the cores 106. For example, the cache 108 may locally cache data stored in a memory 114 for faster access by the components of the processor 102. As shown in FIG. 9, the memory 114 may be in communication with the processors 102 via the interconnection 104. In some embodiments, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 9, memory 114 may be coupled to other components of system 100 through a memory controller 120. Memory 114 may include volatile memory and may be interchangeably referred to as main memory or system memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

The system 100 may communicate with other devices/systems/networks via a network interface 128 (e.g., which is in communication with a computer network and/or the cloud 129 via a wired or wireless interface). For example, the network interface 128 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 129.

System 100 may also include a storage device such as a SSD 130 coupled to the interconnect 104 via SSD controller logic 125. Hence, logic 125 may control access by various components of system 100 to the SSD 130. Furthermore, even though logic 125 is shown to be directly coupled to the interconnection 104 in FIG. 9, logic 125 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), etc.) with one or more other components of system 100 (for example where the storage bus is coupled to interconnect 104 via some other logic like a bus bridge, chipset, etc.) Additionally, logic 125 may be incorporated into memory controller logic (such as those discussed with reference to FIG. 10) or provided on a same integrated circuit (IC) device in various embodiments (e.g., on the same circuit board device as the SSD 130 or in the same enclosure as the SSD 130).

Furthermore, logic 125 and/or SSD 130 may be coupled to one or more sensors (not shown) to receive information (e.g., in the form of one or more bits or signals) to indicate the status of or values detected by the one or more sensors. These sensor(s) may be provided proximate to components of system 100 (or other computing systems discussed herein), including the cores 106, interconnections 104 or 112, components outside of the processor 102, SSD 130, SSD bus, SATA bus, logic 125, circuitry 160, etc., to sense variations in various factors affecting power/thermal behavior of the system/platform, such as temperature, operating frequency, operating voltage, power consumption, and/or inter-core communication activity, etc.

Figure 10:
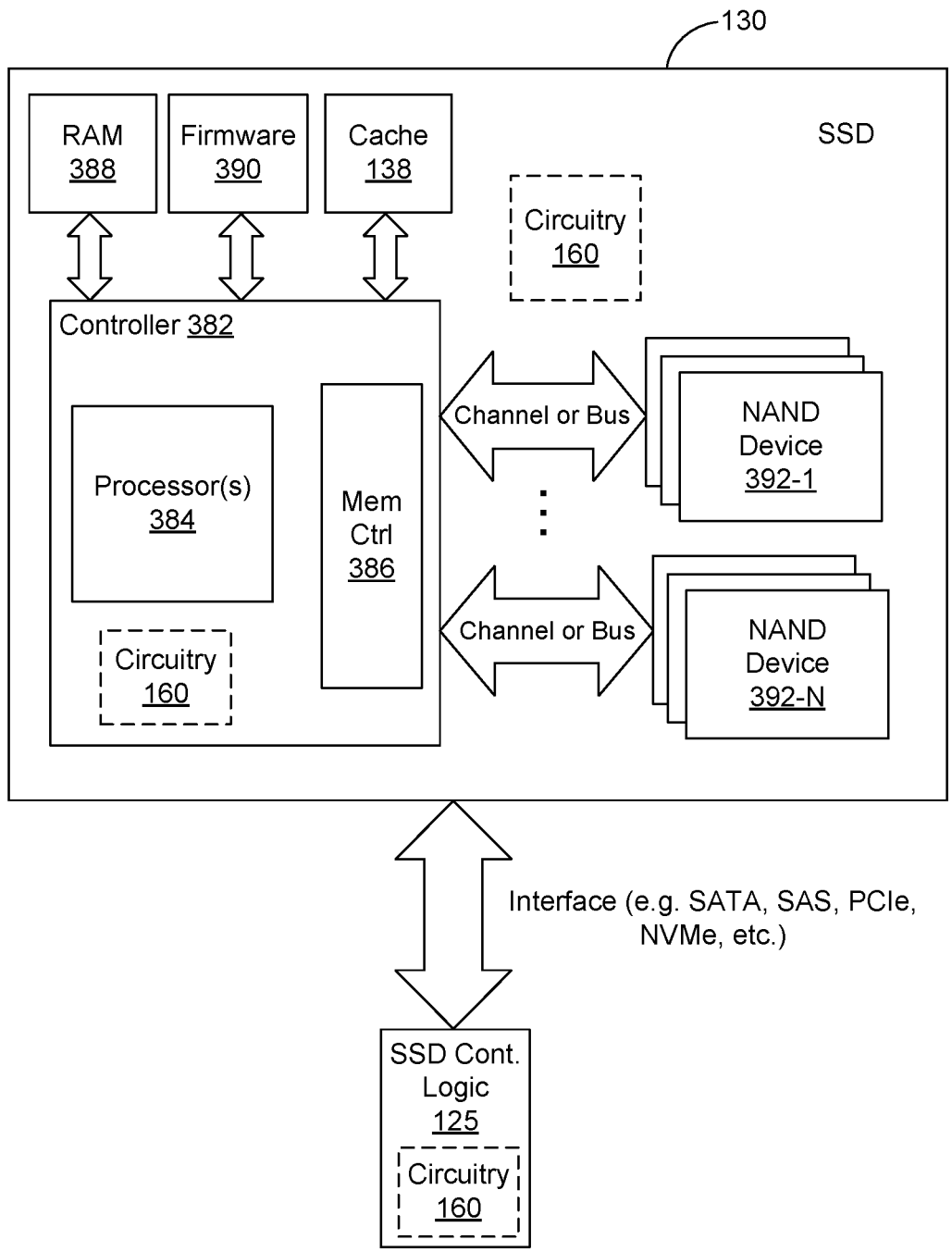
FIG. 10 is a block diagram of an example of a solid-state drive (SSD) device according to an embodiment.

FIG. 10 illustrates a block diagram of various components of the SSD 130, according to an embodiment. As illustrated in FIG. 10, circuitry 160 may be located in various locations such as inside the SSD 130 or controller 382, etc., and may include similar technology as discussed in connection with FIG. 9. The SSD 130 includes a controller 382 (which in turn includes one or more processor cores or processors 384 and memory controller logic 386), cache 138, RAM 388, firmware storage 390, and one or more NAND devices 392-1 to 392-N (collectively NAND media 392). The NAND media 392 is coupled to the memory controller logic 386 via one or more memory channels or busses. Also, SSD 130 communicates with logic 125 via an interface (such as a SATA, SAS, PCIe, NVMe, etc., interface). Processors 384 and/or controller 382 may compress/decompress data written to or read from NAND devices 392-1 to 392-N.

As illustrated in FIGS. 9 and 10, the SSD 130 may include circuitry 160, which may be in the same enclosure as the SSD 130 and/or fully integrated on a printed circuit board (PCB) of the SSD 130. One or more of the features/aspects/operations discussed with reference to FIGS. 1-8 may be performed by one or more of the components of FIGS. 9 and/or 10. Also, one or more of the features/aspects/operations of FIGS. 1-8 may be programmed into the firmware 390. Further, SSD controller logic 125 may also include circuitry 160. Advantageously, the circuitry 160 may include technology to implement one or more aspects of the system 10 (FIG. 1), the system 15 (FIG. 2), the apparatus 20 (FIG. 3), the method 30 (FIGS. 4A TO 4D), the device 54 (FIG. 5), the method 60 (FIG. 6), a statistical probability curve (FIG. 7), a random number generator with a range of random numbers (FIG. 8), and/or any of the features discussed herein.

For example, the circuitry 160 may be configured to maintain respective RD counters for each of two or more tracked units at respective granularities, maintain respective global RD counters for each of the two or more tracked units and, in response to a read request, increment one or more global RD counters that correspond to the read request, determine if a global RD counter for a tracked unit matches a random number associated with the tracked unit, and, if so determined, increment a RD counter for the tracked unit that corresponds to the read request and generate a new random number for the tracked unit. For example, a tracked unit may have any useful granularity. In one example, one of the two or more tracked units may correspond to a WL, and the circuitry 160 may be configured to maintain respective per WL per SGS RD counters. In another example, one of the two or more tracked units may correspond to a selected granularity that spans two or more WLs, and the circuitry 160 may be configured to maintain respective per selected granularity RD counters. In another example, one of the two or more tracked units may correspond to an EB, and the circuitry 160 may be configured to maintain respective per EB RD counters.

In some embodiments, the circuitry 160 may be further configured to determine if one or more of the RD counters exceeds a threshold and, if so determined, trigger relocation of the data. The circuitry 160 may also be configured to journal RD counter information. In some embodiments, at initialization, the circuitry 160 may be configured to initialize all of the RD counters for each of the two or more tracked units to zero, initialize all of the global RD counters for each of the two or more tracked units to zero, and generate respective random numbers for each of the two or more tracked units. In response to a reset for a tracked unit, the circuitry 160 may be configured to reset all of the RD counters for the tracked unit to zero.

In other embodiments, the SSD 130 may be replaced with any suitable storage/memory technology/media. In some embodiments, the circuitry 160 may be coupled to one or more substrates (e.g., silicon, sapphire, gallium arsenide, printed circuit board (PCB), etc.), and may include transistor channel regions that are positioned within the one or more substrates. In other embodiments, the SSD 130 may include two or more types of storage media. For example, the bulk of the storage may be NAND and may further include some faster, smaller granularity accessible (e.g., byte-addressable) NVM. The SSD 130 may alternatively, or additionally, include persistent volatile memory (e.g., battery or capacitor backed-up DRAM or SRAM). For example, the SSD 130 may include POWER LOSS IMMINENT (PLI) technology with energy storing capacitors. The energy storing capacitors may provide enough energy (power) to complete any commands in progress and to make sure that any data in the DRAMs/SRAMs is committed to the non-volatile NAND media. The capacitors may act as backup batteries for the persistent volatile memory. As shown in FIGS. 9 and 10, features or aspects of the circuitry 160 may be distributed throughout the system 100, and/or co-located/integrated with various components of the system 100.

ADDITIONAL NOTES AND EXAMPLES

Example 1 includes an electronic apparatus, comprising one or more substrates, and a controller coupled to the one or more substrates, the controller including circuitry to control access to NAND-based storage media that includes a plurality of NAND devices, maintain respective read disturb (RD) counters for each of two or more tracked units at respective granularities, maintain respective global RD counters for each of the two or more tracked units, and, in response to a read request increment one or more global RD counters that correspond to the read request, determine if a global RD counter for a tracked unit matches a random number associated with the tracked unit, and, if so determined, increment a RD counter for the tracked unit that corresponds to the read request and generate a new random number for the tracked unit.

Example 2 includes the apparatus of Example 1, wherein one of the two or more tracked units corresponds to a wordline (WL), and wherein the circuitry is further to maintain respective per WL per SGS RD counters.

Example 3 includes the apparatus of any of Examples 1 to 2, wherein one of the two or more tracked units corresponds to a selected granularity that spans two or more wordlines, and wherein the circuitry is further to maintain respective per selected granularity RD counters.

Example 4 includes the apparatus of any of Examples 1 to 3, wherein one of the two or more tracked units corresponds to an erase block (EB), and wherein the circuitry is further to maintain respective per EB RD counters.

Example 5 includes the apparatus of any of Examples 1 to 4, wherein the circuitry is further to determine if one or more of the RD counters exceeds a threshold, and, if so determined, trigger relocation of data that corresponds to the RD counter that exceeds the threshold.

Example 6 includes the apparatus of any of Examples 1 to 5, wherein the circuitry is further to journal RD counter information.

Example 7 includes the apparatus of any of Examples 1 to 6, wherein, at initialization, the circuitry is further to initialize all of the RD counters for each of the two or more tracked units to zero, initialize all of the global RD counters for each of the two or more tracked units to zero, and generate respective random numbers for each of the two or more tracked units.

Example 8 includes the apparatus of any of Examples 1 to 7, wherein the controller and the NAND-based storage media are incorporated in a solid-state drive.

Example 9 includes an electronic storage system, comprising NAND-based storage media that includes a plurality of NAND devices, and a controller communicatively coupled to the NAND-based storage media, the controller including circuitry to maintain respective read disturb (RD) counters for each of two or more tracked units at respective granularities, maintain respective global RD counters for each of the two or more tracked units, and, in response to a read request increment one or more global RD counters that correspond to the read request, determine if a global RD counter for a tracked unit matches a random number associated with the tracked unit, and, if so determined, increment a RD counter for the tracked unit that corresponds to the read request and generate a new random number for the tracked unit.

Example 10 includes the system of Example 9, wherein one of the two or more tracked units corresponds to a wordline (WL), and wherein the circuitry is further to maintain respective per WL per SGS RD counters.

Example 11 includes the system of any of Examples 9 to 10, wherein one of the two or more tracked units corresponds to a selected granularity that spans two or more wordlines, and wherein the circuitry is further to maintain respective per selected granularity RD counters.

Example 12 includes the system of any of Examples 9 to 11, wherein one of the two or more tracked units corresponds to an erase block (EB), and wherein the circuitry is further to maintain respective per EB RD counters.

Example 13 includes the system of any of Examples 9 to 12, wherein the circuitry is further to determine if one or more of the RD counters exceeds a threshold, and, if so determined, trigger relocation of data that corresponds to the RD counter that exceeds the threshold.

Example 14 includes the system of any of Examples 9 to 13, wherein the circuitry is further to journal RD counter information.

Example 15 includes the system of any of Examples 9 to 14, wherein, at initialization, the circuitry is further to initialize all of the RD counters for each of the two or more tracked units to zero, initialize all of the global RD counters for each of the two or more tracked units to zero, and generate respective random numbers for each of the two or more tracked units.

Example 16 includes the system of any of Examples 9 to 15, wherein the controller and the NAND-based storage media are incorporated in a solid-state drive.

Example 17 includes a method of controlling storage, comprising controlling access to NAND-based storage media that includes a plurality of NAND devices, maintaining respective read disturb (RD) counters for each of two or more tracked units at respective granularities, maintaining respective global RD counters for each of the two or more tracked units, and, in response to a read request incrementing one or more global RD counters that correspond to the read request, determining if a global RD counter for a tracked unit matches a random number associated with the tracked unit, and, if so determined, incrementing a RD counter for the tracked unit that corresponds to the read request and generating a new random number for the tracked unit.

Example 18 includes the method of Example 17, wherein one of the two or more tracked units corresponds to a wordline (WL), further comprising maintaining respective per WL per SGS RD counters.

Example 19 includes the method of any of Examples 17 to 18, wherein one of the two or more tracked units corresponds to a selected granularity that spans two or more wordlines, further comprising maintaining respective per selected granularity RD counters.

Example 20 includes the method of any of Examples 17 to 19, wherein one of the two or more tracked units corresponds to an erase block (EB), further comprising maintaining respective per EB RD counters.

Example 21 includes the method of any of Examples 17 to 20, further comprising determining if one or more of the RD counters exceeds a threshold, and, if so determined, triggering relocation of data that corresponds to the RD counter that exceeds the threshold.

Example 22 includes the method of any of Examples 17 to 21, further comprising journaling RD counter information.

Example 23 includes the method of any of Examples 17 to 22, further comprising, at initialization initializing all of the RD counters for each of the two or more tracked units to zero, initializing all of the global RD counters for each of the two or more tracked units to zero, and generating respective random numbers for each of the two or more tracked units.

Example 24 includes the method of any of Examples 17 to 23, wherein the NAND-based storage media is incorporated in a solid-state drive.

Example 25 includes at least one non-transitory machine readable medium comprising a plurality of instructions that, in response to being executed on a computing device, cause the computing device to control access to NAND-based storage media that includes a plurality of NAND devices, maintain respective read disturb (RD) counters for each of two or more tracked units at respective granularities, maintain respective global RD counters for each of the two or more tracked units, and, in response to a read request increment one or more global RD counters that correspond to the read request, determine if a global RD counter for a tracked unit matches a random number associated with the tracked unit, and, if so determined, increment a RD counter for the tracked unit that corresponds to the read request and generating a new random number for the tracked unit.

Example 26 includes the at least one non-transitory machine readable medium of Example 25, wherein one of the two or more tracked units corresponds to a wordline (WL), comprising a plurality of further instructions that, in response to being executed on the computing device, cause the computing device to maintain respective per WL per SGS RD counters.

Example 27 includes the at least one non-transitory machine readable medium of any of Examples 25 to 26, wherein one of the two or more tracked units corresponds to a selected granularity that spans two or more wordlines, comprising a plurality of further instructions that, in response to being executed on the computing device, cause the computing device to maintain respective per selected granularity RD counters.

Example 28 includes the at least one non-transitory machine readable medium of any of Examples 25 to 27, wherein one of the two or more tracked units corresponds to an erase block (EB), comprising a plurality of further instructions that, in response to being executed on the computing device, cause the computing device to maintain respective per EB RD counters.

Example 29 includes the at least one non-transitory machine readable medium of any of Examples 25 to 28, comprising a plurality of further instructions that, in response to being executed on the computing device, cause the computing device to determine if one or more of the RD counters exceeds a threshold, and, if so determined, trigger relocation of data that corresponds to the RD counter that exceeds the threshold.

Example 30 includes the at least one non-transitory machine readable medium of any of Examples 25 to 29, comprising a plurality of further instructions that, in response to being executed on the computing device, cause the computing device to journal RD counter information.

Example 31 includes the at least one non-transitory machine readable medium of any of Examples 25 to 30, comprising a plurality of further instructions that, in response to being executed on the computing device, cause the computing device at initialization to initialize all of the RD counters for each of the two or more tracked units to zero, initialize all of the global RD counters for each of the two or more tracked units to zero, and generate respective random numbers for each of the two or more tracked units.

Example 32 includes the at least one non-transitory machine readable medium of any of Examples 25 to 31, wherein the NAND-based storage media is incorporated in a solid-state drive.

Example 33 includes a storage controller apparatus, comprising means for controlling access to NAND-based storage media that includes a plurality of NAND devices, means for maintaining respective read disturb (RD) counters for each of two or more tracked units at respective granularities, means for maintaining respective global RD counters for each of the two or more tracked units, and, in response to a read request means for incrementing one or more global RD counters that correspond to the read request, means for determining if a global RD counter for a tracked unit matches a random number associated with the tracked unit, and, if so determined, means for incrementing a RD counter for the tracked unit that corresponds to the read request and generating a new random number for the tracked unit.

Example 34 includes the apparatus of Example 33, wherein one of the two or more tracked units corresponds to a wordline (WL), further comprising means for maintaining respective per WL per SGS RD counters.

Example 35 includes the apparatus of any of Examples 33 to 34, wherein one of the two or more tracked units corresponds to a selected granularity that spans two or more wordlines, further comprising means for maintaining respective per selected granularity RD counters.

Example 36 includes the apparatus of any of Examples 33 to 35, wherein one of the two or more tracked units corresponds to an erase block (EB), further comprising means for maintaining respective per EB RD counters.

Example 37 includes the apparatus of any of Examples 33 to 36, further comprising means for determining if one or more of the RD counters exceeds a threshold, and, if so determined, means for triggering relocation of data that corresponds to the RD counter that exceeds the threshold.

Example 38 includes the apparatus of any of Examples 33 to 37, further comprising means for journaling RD counter information.

Example 39 includes the apparatus of any of Examples 33 to 38, further comprising, at initialization means for initializing all of the RD counters for each of the two or more tracked units to zero, means for initializing all of the global RD counters for each of the two or more tracked units to zero, and means for generating respective random numbers for each of the two or more tracked units.

Example 40 includes the apparatus of any of Examples 33 to 39, wherein the NAND-based storage media is incorporated in a solid-state drive.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An electronic apparatus, comprising:
one or more substrates; and
a controller coupled to the one or more substrates, the controller including circuitry to control access to NAND-based storage media that includes a plurality of NAND devices, maintain respective read disturb (RD) counters for each of two or more tracked units at respective granularities, maintain respective global RD counters for each of the two or more tracked units, and, in response to a read request:
increment one or more global RD counters that correspond to the read request,
determine if a global RD counter for a tracked unit matches a random number associated with the tracked unit, and, if so determined,
increment a RD counter for the tracked unit that corresponds to the read request and generate a new random number for the tracked unit.

2. The apparatus of claim 1, wherein one of the two or more tracked units corresponds to a wordline (WL), and wherein the circuitry is further to:
maintain respective RD counters on a per WL per source gate select (SGS) basis.

3. The apparatus of claim 1, wherein one of the two or more tracked units corresponds to a selected granularity that spans two or more wordlines, and wherein the circuitry is further to:
maintain respective per selected granularity RD counters.

4. The apparatus of claim 1, wherein one of the two or more tracked units corresponds to an erase block (EB), and wherein the circuitry is further to:
maintain respective per EB RD counters.

5. The apparatus of claim 1, wherein the circuitry is further to:
determine if one or more of the RD counters exceeds a threshold; and, if so determined,
trigger relocation of data that corresponds to the RD counter that exceeds the threshold.

6. The apparatus of claim 1, wherein the circuitry is further to:
journal RD counter information.

7. The apparatus of claim 1, wherein, at initialization, the circuitry is further to:
initialize all of the RD counters for each of the two or more tracked units to zero;
initialize all of the global RD counters for each of the two or more tracked units to zero; and
generate respective random numbers for each of the two or more tracked units.

8. The apparatus of claim 1, wherein the controller and the NAND-based storage media are incorporated in a solid-state drive.

9. An electronic storage system, comprising:
NAND-based storage media that includes a plurality of NAND devices; and
a controller communicatively coupled to the NAND-based storage media, the controller including circuitry to maintain respective read disturb (RD) counters for each of two or more tracked units at respective granularities, maintain respective global RD counters for each of the two or more tracked units, and, in response to a read request:
increment one or more global RD counters that correspond to the read request,
determine if a global RD counter for a tracked unit matches a random number associated with the tracked unit, and, if so determined,
increment a RD counter for the tracked unit that corresponds to the read request and generate a new random number for the tracked unit.

10. The system of claim 9, wherein one of the two or more tracked units corresponds to a wordline (WL), and wherein the circuitry is further to:
maintain respective RD counters on a per WL per source gate select (SGS) basis.

11. The system of claim 9, wherein one of the two or more tracked units corresponds to a selected granularity that spans two or more wordlines, and wherein the circuitry is further to:
maintain respective per selected granularity RD counters.

12. The system of claim 9, wherein one of the two or more tracked units corresponds to an erase block (EB), and wherein the circuitry is further to:
maintain respective per EB RD counters.

13. The system of claim 9, wherein the circuitry is further to:
determine if one or more of the RD counters exceeds a threshold; and, if so determined,
trigger relocation of data that corresponds to the RD counter that exceeds the threshold.

14. The system of claim 9, wherein the circuitry is further to:
journal RD counter information.

15. The system of claim 9, wherein, at initialization, the circuitry is further to:
initialize all of the RD counters for each of the two or more tracked units to zero;
initialize all of the global RD counters for each of the two or more tracked units to zero; and
generate respective random numbers for each of the two or more tracked units.

16. The system of claim 9, wherein the controller and the NAND-based storage media are incorporated in a solid-state drive.

17. A method of controlling storage, comprising:
- controlling access to NAND-based storage media that includes a plurality of NAND devices;
- maintaining respective read disturb (RD) counters for each of two or more tracked units at respective granularities;
- maintaining respective global RD counters for each of the two or more tracked units, and, in response to a read request:
  - incrementing one or more global RD counters that correspond to the read request,
  - determining if a global RD counter for a tracked unit matches a random number associated with the tracked unit, and, if so determined,
  - incrementing a RD counter for the tracked unit that corresponds to the read request and generating a new random number for the tracked unit.

18. The method of claim 17, wherein one of the two or more tracked units corresponds to a wordline (WL), further comprising:
- maintaining respective RD counters on a per WL per source gate select (SGS) basis.

19. The method of claim 17, wherein one of the two or more tracked units corresponds to a selected granularity that spans two or more wordlines, further comprising:
- maintaining respective per selected granularity RD counters.

20. The method of claim 17, wherein one of the two or more tracked units corresponds to an erase block (EB), further comprising:
- maintaining respective per EB RD counters.

21. The method of claim 17, further comprising:
- determining if one or more of the RD counters exceeds a threshold; and, if so determined,
- triggering relocation of data that corresponds to the RD counter that exceeds the threshold.

22. The method of claim 17, further comprising:
- journaling RD counter information.

23. The method of claim 17, further comprising, at initialization:
- initializing all of the RD counters for each of the two or more tracked units to zero;
- initializing all of the global RD counters for each of the two or more tracked units to zero; and
- generating respective random numbers for each of the two or more tracked units.

24. The method of claim 17, wherein the NAND-based storage media is incorporated in a solid-state drive.

* * * * *